(12) United States Patent
Kee et al.

(10) Patent No.: US 9,287,872 B2
(45) Date of Patent: Mar. 15, 2016

(54) PVT COMPENSATION SCHEME FOR OUTPUT BUFFERS

(71) Applicant: Lattice Semiconductor Corporation, Hillsboro, OR (US)

(72) Inventors: Siak Chon Kee, Milpitas, CA (US); Giap Tran, San Jose, CA (US); Brad Sharpe-Geisler, San Jose, CA (US)

(73) Assignee: LATTICESEMICON-DUCTORCORPORATION, Portland, OR (US)

( * ) Notice: Subject to any disclaimer, the term of this patent is extended or adjusted under 35 U.S.C. 154(b) by 0 days.

(21) Appl. No.: 14/308,747

(22) Filed: Jun. 19, 2014

(65) Prior Publication Data

US 2015/0372679 A1 Dec. 24, 2015

(51) Int. Cl.
*G05F 1/10* (2006.01)
*H03K 19/0185* (2006.01)
*G05F 1/46* (2006.01)

(52) U.S. Cl.
CPC ........ *H03K 19/018514* (2013.01); *G05F 1/463* (2013.01)

(58) Field of Classification Search
CPC ................ H03K 19/00384; H03K 19/017581; H03K 19/018542; H03K 19/018585
See application file for complete search history.

(56) References Cited

U.S. PATENT DOCUMENTS

| 6,549,036 | B1 | 4/2003 | Lee | |
|---|---|---|---|---|
| 6,792,372 | B2 | 9/2004 | Lee | |
| 7,138,851 | B2 * | 11/2006 | Sumita et al. | 327/534 |
| 7,221,193 | B1 | 5/2007 | Wang et al. | |
| 8,604,843 | B2 * | 12/2013 | Kim | 327/108 |
| 8,692,585 | B2 * | 4/2014 | Kang | 327/108 |
| 8,891,329 | B2 * | 11/2014 | Yang | 365/226 |
| 2008/0112246 | A1 | 5/2008 | Mei | |

OTHER PUBLICATIONS

"Technical Note—DDR3 ZQ Calibration," TN-41-02, 2008, Micron Technologies, Inc., PDF: 09005aef83207fed/Source: 09005aef82eccf52, pp. 1-5.

* cited by examiner

*Primary Examiner* — Jeffrey Zweizig

(57) ABSTRACT

In one integrated circuit embodiment, a programmable pull-down output buffer is calibrated by sequentially configuring the buffer at different drive-strength levels and adjusting a source current applied to the buffer until the voltage at an input node of the buffer reaches a reference voltage level. A programmable pull-up output buffer is then calibrated by sequentially configuring a pull-down output buffer based on the pull-down buffer calibration results and adjusting the drive-strength level of the pull-up buffer until the voltage at a common node between the two buffers reaches a reference voltage level. Average calibration results are generated by averaging multiple calibration results for each setting. Output buffers are thereby calibrated to compensate for PVT variations without using any external resistors and without requiring any I/O pins of the integrated circuit.

14 Claims, 4 Drawing Sheets

PVT COMPENSATION SCHEME FOR OUTPUT BUFFERS

BACKGROUND

1. Field of the Invention

The present invention relates to integrated circuits and, more specifically but not exclusively, to techniques for calibrating output drivers in integrated circuits to compensate for PVT variations.

2. Description of the Related Art

This section introduces aspects that may help facilitate a better understanding of the invention. Accordingly, the statements of this section are to be read in this light and are not to be understood as admissions about what is prior art or what is not prior art.

It is well known that integrated circuitry is susceptible to process, voltage, and temperature (PVT) variations in which the circuitry functions differently due to differences in the manufacturing process between different instances of an integrated circuit as well as due to changes in voltage and/or temperature over time for a given instance of the integrated circuit. It is also well known to perform periodic or intermittent calibration operations to characterize the extent of changes in circuit functionality as a result of such PVT variations and then use that characterization to adjust the circuitry to compensate for the effects of those PVT variations.

Output buffers (aka output drivers), which transmit outgoing signals from an integrated circuit, are an example of a type of circuitry that is susceptible to PVT variations and is calibrated in order to compensate for the effects of those PVT variations. A conventional technique for calibrating output buffers involves connecting an output buffer to an external resistor having a known resistance level, using the output buffer to drive an outgoing signal across the external resistor, and measuring the voltage across the external resistor to characterize the drive strength (e.g., current level) of the output buffer. Depending on the results, the configuration of the output buffer can then be adjusted to achieve a desired drive strength.

In order to avoid interfering with on-line operations, integrated circuits are typically designed with extra output buffers, referred to herein as calibration buffers, that are used only for PVT calibration, where the calibrated PVT characteristics of a given calibration buffer are assumed to be the same as the PVT characteristics of a number of on-line output buffers. A given integrated circuit may have multiple calibration buffers because the integrated circuit may have different types of on-line output buffers (for example, pull-up buffers and pull-down buffers) as well as output buffers operating under different voltage domains. Furthermore, since PVT conditions may vary over different portions of an integrated circuit, there may be different calibration buffers for different banks of output drivers around the periphery of the integrated circuit. These different calibration buffers are connected to multiple output resistors (having possibly different resistance levels) via multiple output pins, which reduce the number of output pins available for the rest of the integrated circuitry.

BRIEF DESCRIPTION OF THE DRAWINGS

Other embodiments of the invention will become more fully apparent from the following detailed description, the appended claims, and the accompanying drawings in which like reference numerals identify similar or identical elements.

DETAILED DESCRIPTION

Figure 1:
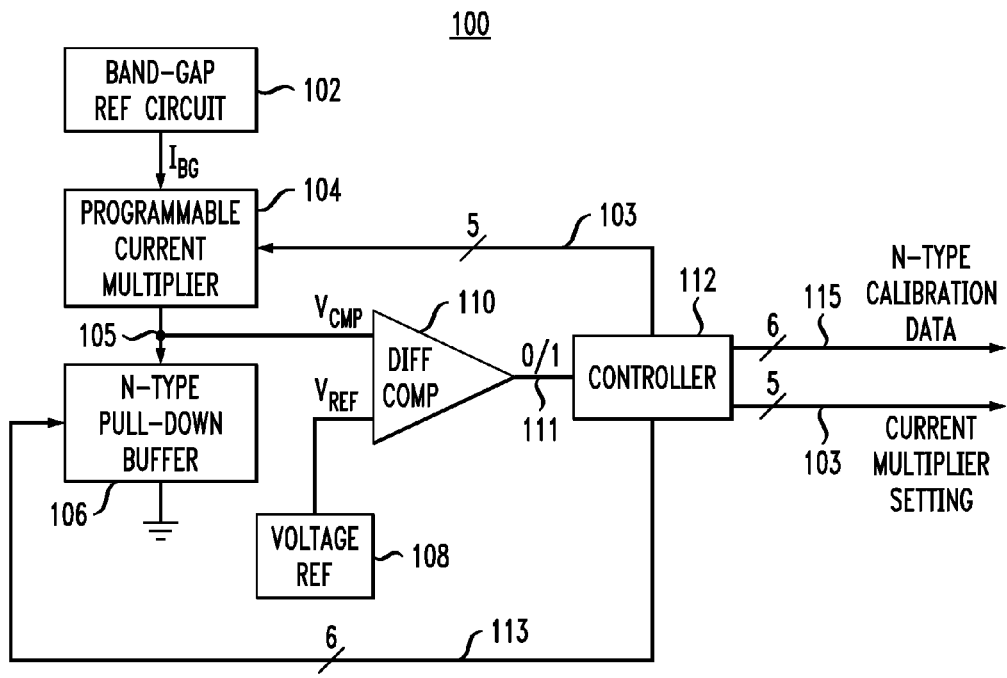
FIG. 1 shows a simplified schematic block diagram of pull-down calibration circuitry configured to calibrate an N-type pull-down output buffer for PVT variations in an integrated circuit.

FIG. 1 shows a simplified schematic block diagram of pull-down calibration circuitry 100 configured to calibrate an N-type pull-down output buffer 106 for PVT variations in an integrated circuit.

In operation, band-gap reference circuit 102 generates a known, fixed current $I_{BG}$, which programmable current multiplier 104 multiplies based on a multiplier signal 103, whose value is controlled by controller 112. The resulting multiplied current is applied as a known source current to programmable pull-down buffer 106 at a node 105, which is also connected to one of the two inputs to differential comparator 110, whose other input is connected to the output of a voltage reference generator 108. Differential comparator 110 (i) compares the voltage level $V_{CMP}$ at node 105 to the reference voltage level $V_{REF}$ from reference generator 108 and (ii) generates a binary output signal 111, whose value depends on which of the two input voltage levels is higher.

Controller 112, which also controls the configuration of programmable pull-down buffer 106 via configuration control signal 113, keeps track of the results of the voltage comparisons performed by comparator 110 for different multiplier values and different buffer configurations to calibrate the present operating characteristics of pull-down buffer 106. These calibration results can then be used to adjust the operating configurations of a number of other programmable on-line pull-down buffers in the integrated circuit that are assumed to have the same PVT characteristics as pull-down buffer 106. As indicated in FIG. 1, controller 112 outputs the 6-bit N-type calibration data 115 as well as the 5-bit current multiplier setting 103 corresponding to that calibration data.

Figure 2:
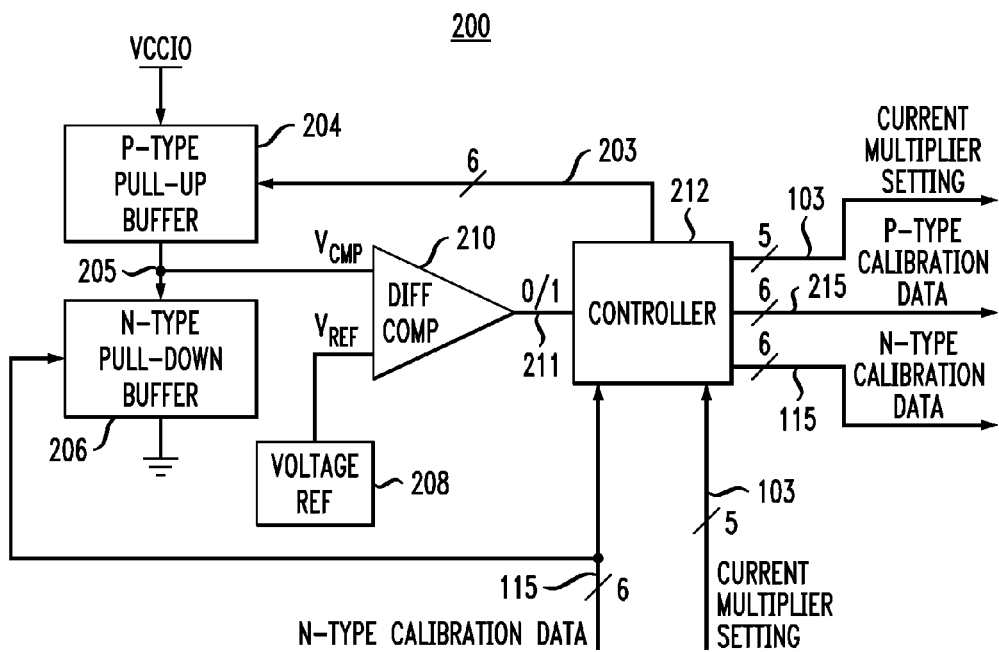
FIG. 2 shows a simplified schematic block diagram of pull-up calibration circuitry configured to calibrate a P-type pull-up output buffer for PVT variations in an integrated circuit.

FIG. 2 shows a simplified schematic block diagram of pull-up calibration circuitry 200 configured to calibrate a P-type pull-up output buffer 204 for PVT variations in an integrated circuit. Pull-up calibration circuitry 200 is similar to pull-down calibration circuitry 100 of FIG. 1, except that, instead of using a programmable current multiplier driven by a band-gap reference circuit to generate a source current for a pull-down buffer as in pull-down calibration circuitry 100, pull-up calibration circuitry 200 uses N-type pull-down buffer 206 to generate a sink current for pull-up buffer 204.

In operation, depending on the particular implementation, when pull-up buffer 204, for example, operates under the same voltage domain as pull-down buffer 106 of FIG. 1, then pull-down buffer 206 is the same type of output buffer as pull-down buffer 106 and is configured based on the 6-bit N-type calibration data 115 generated by controller 112 of pull-down calibration circuitry 100 of FIG. 1 to generate a known sink current for pull-up buffer 204. (Note that, in some implementations, pull-down buffer 106 of FIG. 1 might even be used as pull-down buffer 206 of FIG. 2.)

As in pull-down calibration circuitry 100 of FIG. 1, differential comparator 210 generates binary output signal 211, whose value depends on which of (i) voltage level $V_{CMP}$ of node 205 between pull-up buffer 204 and pull-down buffer 206 and (ii) reference voltage level $V_{REF}$ from voltage reference generator 208 is greater. Controller 212 controls the configuration of programmable pull-up buffer 204 via configuration control signal 203 and keeps track of the results of the voltage comparisons for different buffer configurations to calibrate the present operating characteristics of pull-up buffer 204. These calibration results can then be used to adjust the operating configurations of a number of other programmable on-line pull-up buffers in the integrated circuit that are assumed to have the same PVT characteristics as pull-up buffer 204. As indicated in FIG. 2, controller 212 outputs the 6-bit P-type calibration data 215 as well as the 5-bit current multiplier setting 103 and the 6-bit N-type calibration data 115 corresponding to that P-type calibration data.

As described previously, an integrated circuit may have a number of different banks of output (and input) buffers located around the periphery of the integrated circuit, where:
  Each bank operates under a particular voltage domain;
  Different banks may operate under the same or different voltage domains;
  Each bank has both pull-down output buffers and pull-up output buffers; and
  Each output buffer can be configured to operate at any one of a number of different drive-strength levels.

It is known that, for some integrated circuits, the operating characteristics of pull-down buffers do not vary significantly over the layout of a typical chip, but that the operating characteristics of pull-up buffers can vary significantly from bank to bank over that layout. As such, for each different output buffer voltage domain in an integrated circuit, the chip might have only a single instance of pull-down calibration circuitry 100 of FIG. 1, but one instance of pull-up calibration circuitry 200 of FIG. 2 for each bank operating under that same voltage domain. For example, an integrated circuit having 16 I/O (input/output) banks, each operating at one of three different voltage domains, can be designed to have three instances of pull-down calibration circuitry 100 (one for each different voltage domain) and 16 instances of pull-up calibration circuitry 200 (one for each different I/O bank).

Assume that an exemplary integrated circuit has five different I/O banks that operate under a 2.5V voltage domain, where each pull-down buffer and each pull-up buffer is configurable to operate at any one of 64 different drive-strength levels. Such an integrated circuit could have a single instance of pull-down calibration circuitry 100 of FIG. 1 configured to operate under the 2.5V voltage domain and five instances of pull-up calibration circuitry 200 of FIG. 2, each located in a different one of those five I/O banks and each configured to operate under the 2.5V voltage domain. Note that the integrated circuit may also have one or more additional I/O banks operating under one or more other voltage domains and therefore other instances of calibration circuitries 100 and 200 for those additional I/O banks and other voltage domains. Furthermore, in some implementations having pull-down buffers driven by a power-supply voltage (e.g., VCCAUX) that is independent of the corresponding bank voltage domain, an integrated circuit having multiple different I/O voltage domains may have only a single instance of pull-down calibration circuitry 100, where the corresponding N-type calibration results are used for all of the pull-down buffers operating at the different voltage domains. The following discussion will focus on only the five I/O banks operating under the 2.5V voltage domain.

Figure 3:
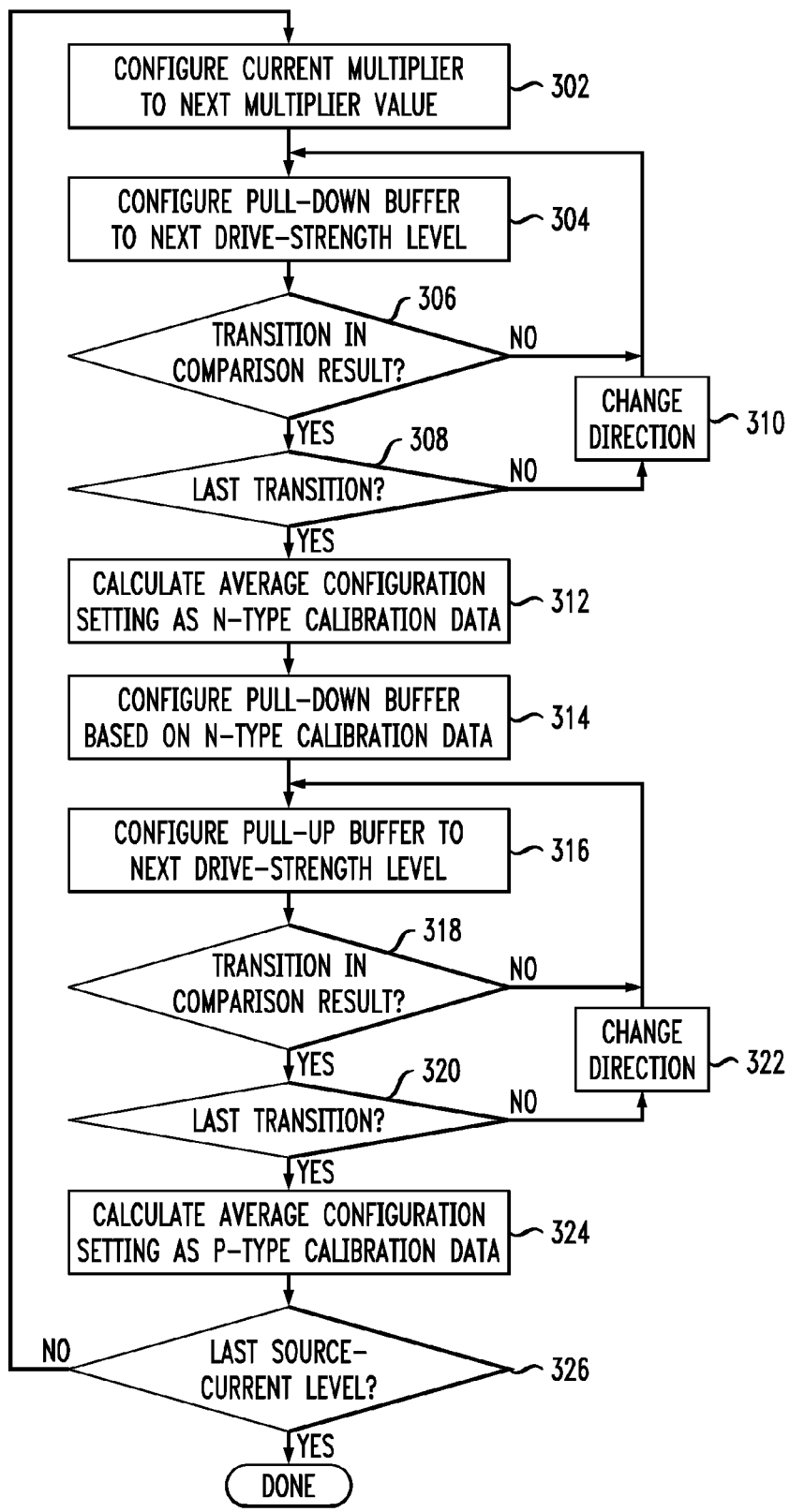
FIG. 3 shows a flow diagram of exemplary calibration processing performed by the pull-down calibration circuitry of FIG. 1 to characterize the present operations of the pull-down buffer of FIG. 1 and by the pull-up calibration circuitry of FIG. 2 to characterize the present operations of the pull-up buffer of FIG. 2.

FIG. 3 shows a flow diagram of exemplary calibration processing performed by pull-down calibration circuitry 100 of FIG. 1 to characterize the present operations of the one instance of pull-down buffer 106 for the five I/O banks operating under the 2.5V voltage domain as well as exemplary calibration processing performed by each of the five instances of pull-up calibration circuitry 200 of FIG. 2 to characterize the present operations of the five corresponding instances of pull-up buffer 204 for the five I/O banks operating under the 2.5V voltage domain. Analogous calibration processing could be performed for any additional I/O banks operating under any different voltage domains.

In general, the calibration processing involves (A) controller 112 of FIG. 1 sequentially setting the source current applied by current multiplier 104 to pull-down buffer 106 at each of 32 different source-current levels supported by 5-bit current multiplier 104 and (B) at each different source-current level, (i) controller 112 varying the configuration of programmable pull-down buffer 106 until a specified number (e.g., eight) of transitions in comparator 110's binary output signal 111 are detected; (ii) controller 112 averaging the pull-down buffer-configuration settings corresponding to those specified number of transitions to determine an average pull-down buffer-configuration setting associated with the present source-current level, (iii) controller 112 configuring the pull-down buffer 206 in each pull-up calibration circuitry 200 of FIG. 2 using the average pull-down buffer-configuration setting, (iv) controller 212 varying the configuration of programmable pull-up buffer 204 until a specified number (e.g., eight) of transitions in comparator 210's binary output signal 211 are detected, and (v) controller 212 averaging the pull-up buffer-configuration settings corresponding to those specified number of transitions to determine an average pull-up buffer-configuration setting associated with the present source-current level of FIG. 1.

Those skilled in the art will understand that the 32 different source-current levels correspond to different combinations of a number of different off-chip termination impedances (e.g., ranging from 50 ohms to 150 ohms) and a number of different buffer drive-strength levels (e.g., ranging from 4 ma to 16 ma). Other embodiments may involve different numbers and different magnitudes of source-current levels.

Note that, depending on the voltage level of reference voltage $V_{REF}$, as the drive-strength level of pull-down buffer 106 is incrementally increased or decreased, a transition in binary output signal 111 corresponds to a situation in which the drive-strength level of pull-down buffer 106 reaches a specific relationship with the current level generated by current multiplier 104. For example, for a 2.5V voltage domain, if $V_{REF}$=1.25V, then a transition in binary output signal 111 corresponds to the situation in which the drive-strength level of pull-down buffer 106 is equal to the current level generated by current multiplier 104. Analogous statements may be made regarding reference voltage $V_{REF}$ and pull-up buffer 204 of FIG. 2.

Referring to FIG. 3, in step 302, controller 112 uses 5-bit control signal 103 to configure programmable current multiplier 104 to generate a source current at a particular current level. In one possible implementation, controller 112 starts the calibration processing with the current multiplier programmed at zero and, with each iteration of step 302, increments by one level up to its highest current level (i.e., 31 times the lowest non-zero current level).

In step 304, for the current multiplier's initial level, controller 112 uses 6-bit control signal 113 to configure pull-down buffer 106 at its initial drive-strength level. At this initial setting, the output of differential comparator 110 will be a known value (i.e., 0 or 1 depending on how the voltage comparison is defined) and, since there will have been no previous comparison result, processing will return to step 304, in which controller 112 increments control signal 113 by 1 to re-configure pull-down buffer 106 at its next (higher) drive-strength level. As long as there is still no transition in the comparison result generated by comparator 110 (step 306), then processing will continue to return to step 304 and controller 112 will continue to increase the pull-down buffer's drive-strength level until a transition in the comparison result is detected at step 306, in which case, processing continues to step 308.

In order to filter out spurious results, the calibration processing generates a specified number of calibration results (corresponding to the specified number of detected transitions in binary output signal 111) at each source-current level generated by current multiplier 104. This could be achieved by stepping down pull-down buffer drive-strength level after each transition is detected in step 306 and repeating the processing of steps 304 and 306 until the next transition is detected. The calibration processing of FIG. 3 uses an alternative approach in which the direction of changes in the drive-strength level of step 304 is reversed after each transition is detected in step 306 until the specified number of transitions has been detected.

As such, as described above, the first transition is detected by increasing the pull-down buffer's drive strength from its lowest level to the particular drive-strength level at which the comparison result 111 changes from its original result. The second transition is then detected by decreasing the drive strength from that particular drive-strength setting until the comparison result changes back to the original result at some other drive-strength level. The third transition is then detected by increasing the drive strength from that other drive-strength setting until the comparison result again changes from the original result, and so on, until the specified number of transitions are detected.

In some implementations, the initial drive-strength setting for a given sequence in one direction of level changes may be offset (higher or lower, as appropriate) from the drive-strength setting at which the previous transition was detected. For example, if a transition was detected at a drive-strength setting of, say, 25 while increasing the drive-strength, then the initial drive-strength setting for the next calibration sequence in which the drive-strength level is decreased, may be offset above 25 to, for example, 30. If the next transition is detected at a drive-strength setting of 23, then the initial drive-strength setting for the next calibration sequence in which the drive-strength level is again increased, may be offset below 23 to, for example, 18. In either case, the calibration processing will be faster than if the drive-strength setting is always returned to its lowest level after each transition is detected.

Returning again to FIG. 3, if the transition detected in step 306 is not the last transition for the existing multiplier value (step 308), then, in step 310, controller 112 changes the direction of changes in the pull-down buffer drive-strength level and, in step 304, controller 112 configures the pull-down buffer to its next setting (step 304), which, as described above, may be the same setting at which the previous transition was detected or a setting appropriately offset above or below that setting. This processing of steps 304-310 continues until controller 112 determines, at step 308, that the specified number of transitions have been detected. In step 312, controller 112 calculates and saves the average pull-down buffer setting for the present source-current level as N-type calibration data 115 based on the settings corresponding to the specified number of detected transitions before proceeding to step 314.

In step 314, pull-down buffer 206 of FIG. 2 is configured based on N-type calibration data 115. Controller 212 then implements steps 316-324 for pull-up calibration circuitry 200 that are analogous to step 304-312 implemented by controller 112, in order to generate an average pull-up buffer setting for the present source-current level as P-type calibration data 215.

If the present source-current level is not the final (e.g., the highest) level (step 326), then processing returns to step 302, where controller 112 increments control signal 103 to re-configure current multiplier 104 to its next (e.g., higher) source-current level. Processing then proceeds to step 304 to repeat steps 304-324 for that next source-current level. Note that the initial pull-down buffer drive-strength level selected in step 304 for the next source-current level set in step 302 need not be the lowest non-zero drive-strength level. Rather, the initial pull-down buffer drive-strength level of step 304 can be selected based on the average buffer drive-strength setting determined by controller 112 in step 312 for the previous (lower) source-current level. Either the previous average buffer drive-strength setting of step 312 may be used as the initial buffer drive-strength setting or some (e.g., slightly lower) setting suitably offset from that buffer drive-strength setting. In any case, the calibration processing will be faster than if the buffer drive-strength setting is always returned to its lowest level at the beginning of the calibration processing for each different source-current level. The same may be true for the initial pull-up buffer drive-strength level of step 316.

Calibration processing of pull-down buffer 106 and each pull-up buffer 204 is complete when controller 112 determines in step 326 that the calibration processing at the last (e.g., highest) source-current level has been completed.

As indicated in FIGS. 1 and 2, when controllers 112 and 212 have completed the calibration processing of the one instance of pull-down buffer 106 and the five instances of pull-up buffer 204, the controllers will have respectively generated N-type and P-type calibration data sufficient to program all of the on-line N-type pull-up and P-type pull-down output buffers located in the five I/O banks operating under the 2.5V voltage domain.

Note that, after pull-down buffer 106 has been calibrated at a particular source-current level, the five instances of pull-up buffer 204 can all be independently calibrated at the same time for that same source-current level. Furthermore, while the five instances of pull-up buffer 204 are being calibrated for that source-current level, pull-down buffer 106 can be simultaneously calibrated at the next source-current level. Depending on the particular needs, the integrated circuit can be configured either (i) to repeat automatically the calibration processing periodically or continuously or (ii) to initiate the calibration processing manually as desired.

A full set of calibration results comprises buffer-configuration settings for both pull-down and pull-up buffers, for all output-buffer voltage domains of the integrated circuit, and for all available (e.g., 32 different) drive-strength levels.

After or as calibration results are generated, the corresponding buffer-configuration settings can be distributed to the appropriate on-line output buffers for storage and use. It will be appropriate to use a newly calibrated buffer-configuration setting for a particular on-line output buffer if:

The on-line output buffer is of the same type (i.e., pull-down or pull-up) as the calibration buffer used to generate the setting;

The on-line output buffer operates under the same voltage domain as the calibration buffer used to generate the setting; and The on-line output buffer is to be configured at the same drive-strength level for which the setting was generated.

In one implementation, the integrated circuit has two registers for each on-line buffer: one register for storing the configuration setting currently being used by the on-line buffer and a second register for storing the next configuration setting to be used by the on-line buffer. When new calibration results are available, the corresponding buffer-configuration setting is stored in the register that is not currently being used. When the on-line buffer is next not being used for active processing, the roles of the two registers are swapped, in a ping-pong fashion, such that the on-line buffer is automatically reconfigured using the new configuration setting and the next configuration setting will be stored in the other register.

In some integrated circuits, output buffers of lower strength can be used to calibrate on-line output buffers of greater strength. In those integrated circuits, pull-down buffers 106 and 206 and pull-up buffer 204 of FIGS. 1 and 2 can be designed to operate at lower drive-strength levels (e.g., one half or one quarter) than the on-line buffers that they are being used to calibrate. This can reduce the layout area and/or the amount of power needed to provision and operate calibration circuitries 100 and 200 of FIGS. 1 and 2.

Figure 4:
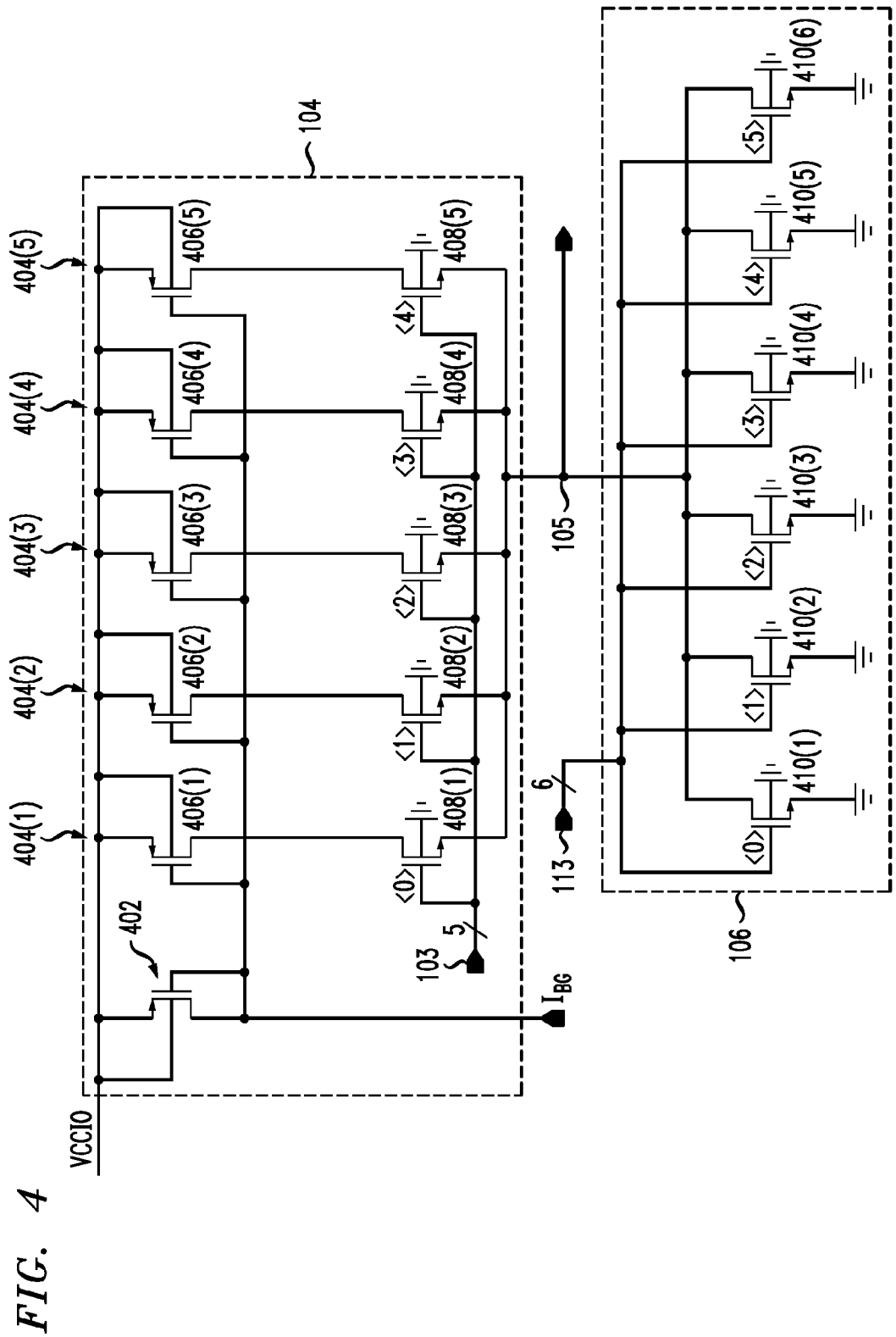
FIG. 4 shows a schematic circuit diagram of the current multiplier and the pull-down buffer of the pull-down calibration circuit of FIG. 1.

FIG. 4 shows a schematic circuit diagram of current multiplier 104 and pull-down buffer 106 of pull-down calibration circuit 100 of FIG. 1.

As shown in FIG. 4 and as understood by those skilled in the art, current multiplier 104 is implemented using a current master 402 connected to sink band-gap current $I_{BG}$ generated by band-gap reference circuit 102 of FIG. 1 and five parallel, switched current-mirror legs 404(1)-404(5), each leg having a P-type mirror device 406(i) in series with an N-type switch device 408(i) and each leg 404(i+1) having twice the current level of the previous leg 404(i). By controlling the five switches 408 using the five-bit control signal 103, controller 112 of FIG. 1 is able to selectively generate source currents having levels from 0 to 31 times the current level of the weakest leg 404(1).

Pull-down buffer 106 is implemented using six parallel N-type transistors 410(1)-410(6), each transistor 410(i+1) having twice the drive strength of the previous transistor 410(i). By controlling these six transistors using the 6-bit control signal 113, controller 112 of FIG. 1 is able to selectively configure the drive-strength level of pull-down buffer 106 to be anywhere from 0 to 63 times the drive strength of the smallest N-type transistor 410(1).

Figure 5:
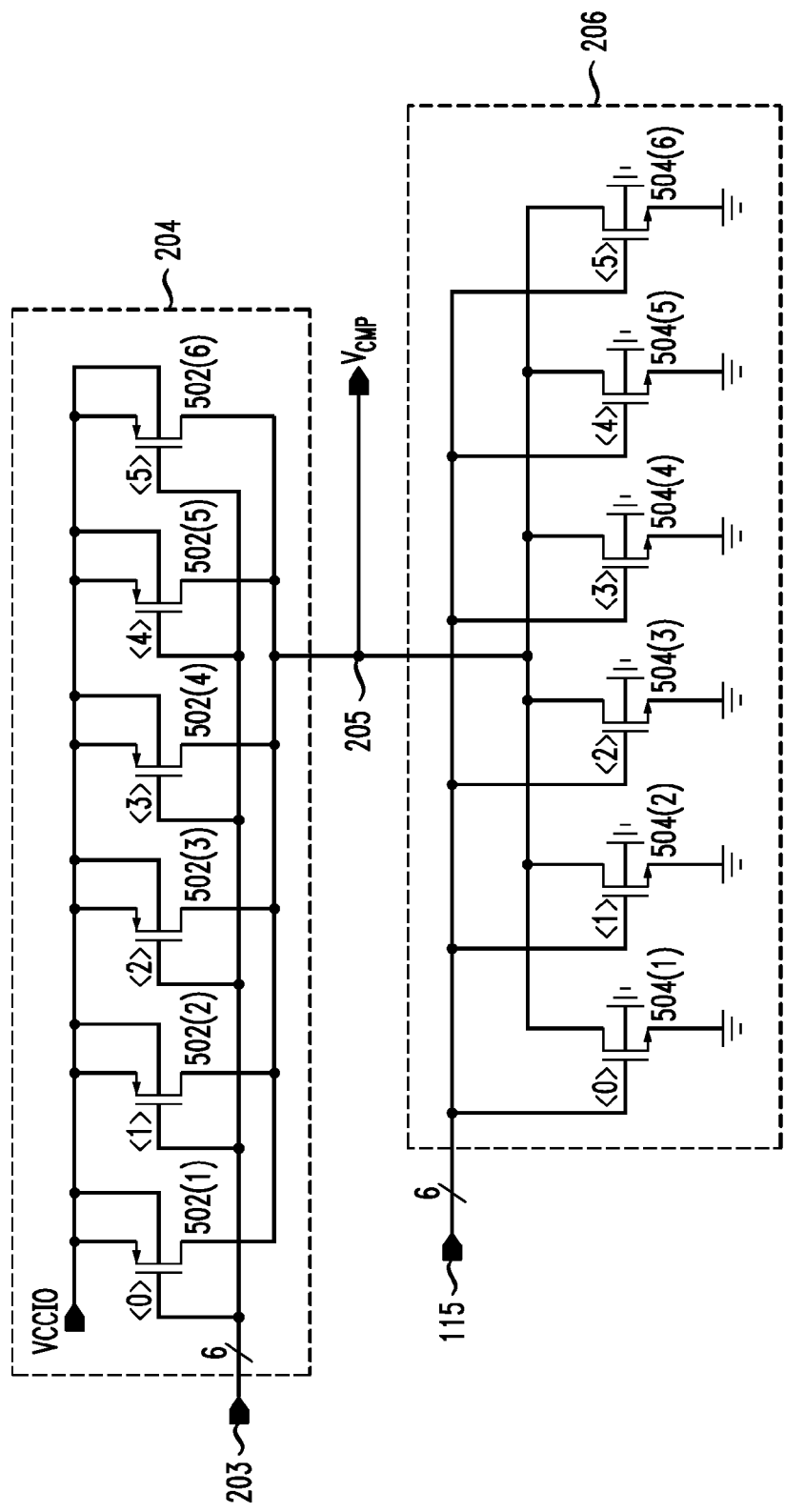
FIG. 5 shows a schematic circuit diagram of the pull-up buffer and the pull-down buffer of the pull-up calibration circuit of FIG. 2.

FIG. 5 shows a schematic circuit diagram of pull-up buffer 204 and pull-down buffer 206 of pull-up calibration circuit 200 of FIG. 2. Pull-up buffer 204 is implemented using six parallel P-type transistors 502(1)-502(6), each transistor 502(i+1) having twice the drive strength of the previous transistor 502(i), and pull-down buffer 206 is implemented using six parallel N-type transistors 504(1)-504(6), each transistor 504(i+1) having twice the drive strength of the previous transistor 504(i). N-type calibration data 115 from controller 112 of FIG. 1 configures the six transistors 504(1)-504(6) of pull-down buffer 206 to one of the 64 different available drive-strength levels. By controlling the six transistors 502(1)-502(6) of pull-up buffer 204 using 6-bit control signal 203, controller 212 of FIG. 2 is able to selectively and independently configure the drive-strength level of pull-up buffer 204 to be anywhere from 0 to 63 times the drive strength of the smallest P-type transistor 502(1).

Although the present disclosure has been described in the context of specific implementations of calibration circuits, e.g., having a 5-bit current multiplier and 6-bit output buffers, those skilled in the art will understand that the present disclosure covers other implementations having different suitable numbers of bits.

Depending on the implementation, in addition to the multiplier value applied by the current multiplier and the drive-strength levels of the output buffers being programmable, there may be other parameters of other components in the calibration circuits that are programmable, such as the band-gap current $I_{BG}$ generated by band-gap reference circuit 102 (which functions as the magnitude of the source-current increment) and the reference voltages generated by voltage reference circuits 108 and 208.

Similarly, although the calibration processing has been described as being implemented using the particular procedures shown in FIG. 3, those skilled in the art will also understand that alternative suitable procedures are also possible.

Calibration circuits of the present disclosure can be used to calibrate pull-down and pull-up output buffers for PVT characteristics without using any I/O pins to connect to any external resistors. Furthermore, because the calibration circuits use special calibration buffers, the calibration processing can be performed in the background, transparent to the user, without interrupting or otherwise interfering with the on-line operations of the integrated circuit. In addition, the calibration processing can be performed during low-power operations of the rest of the integrated circuit to limit peak power consumption.

For purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

Also, for purposes of this disclosure, it is understood that all gates are powered from a fixed-voltage power domain (or domains) and ground unless shown otherwise. Accordingly, all digital signals generally have voltages that range from approximately ground potential to that of one of the power domains and transition (slew) quickly. However and unless stated otherwise, ground may be considered a power source having a voltage of approximately zero volts, and a power source having any desired voltage may be substituted for ground. Therefore, all gates may be powered by at least two power sources, with the attendant digital signals therefrom having voltages that range between the approximate voltages of the power sources.

Signals and corresponding nodes, ports, or paths may be referred to by the same name and are interchangeable for purposes here.

Transistors are typically shown as single devices for illustrative purposes. However, it is understood by those with skill in the art that transistors will have various sizes (e.g., gate width and length) and characteristics (e.g., threshold voltage, gain, etc.) and may consist of multiple transistors coupled in parallel to get desired electrical characteristics from the combination. Further, the illustrated transistors may be composite transistors.

As used in this specification and claims, the term "channel node" refers generically to either the source or drain of a metal-oxide semiconductor (MOS) transistor device (also referred to as a MOSFET), the term "channel" refers to the path through the device between the source and the drain, and the term "control node" refers generically to the gate of the MOSFET. Similarly, as used in the claims, the terms "source," "drain," and "gate" should be understood to refer either to the source, drain, and gate of a MOSFET or to the emitter, collector, and base of a bi-polar device when an embodiment of the invention is implemented using bi-polar transistor technology.

It should be appreciated by those of ordinary skill in the art that any block diagrams herein represent conceptual views of illustrative circuitry embodying the principles of the invention. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Unless explicitly stated otherwise, each numerical value and range should be interpreted as being approximate as if the word "about" or "approximately" preceded the value or range.

It will be further understood that various changes in the details, materials, and arrangements of the parts which have been described and illustrated in order to explain embodiments of this invention may be made by those skilled in the art without departing from embodiments of the invention encompassed by the following claims.

In this specification including any claims, the term "each" may be used to refer to one or more specified characteristics of a plurality of previously recited elements or steps. When used with the open-ended term "comprising," the recitation of the term "each" does not exclude additional, unrecited elements or steps. Thus, it will be understood that an apparatus may have additional, unrecited elements and a method may have additional, unrecited steps, where the additional, unrecited elements or steps do not have the one or more specified characteristics.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

What is claimed is:

1. A method for calibrating buffers in an integrated circuit, the method comprising:
   (a) applying a selected source-current level to a first pull-down buffer at a first node;
   (b) adjusting drive-strength level of the first pull-down buffer until a first voltage at the first node reaches a first reference voltage level to determine a N-type calibration setting for the first pull-down buffer;
   (c) applying the N-type calibration setting to a second pull-down buffer connected to a first pull-up buffer at a second node; and
   (d) adjusting drive-strength level of the first pull-up buffer until a second voltage at the second node reaches a second reference voltage level to determine a P-type calibration setting for the first pull-up buffer.

2. A The invention of claim 1, wherein:
   the integrated circuit has (i) a single instance of the first pull-down buffer and (ii) a different instance of the second pull-down buffer and a different instance of the first pull-up buffer for each different bank in the integrated circuit;
   the N-type calibration setting is applied to one or more on-line pull-down buffers in the integrated circuit; and
   for one or more banks, the P-type calibration setting is applied to one or more on-line pull-up buffers in the bank.

3. A The invention of claim 1, further comprising:
   (e) selecting a different source-current level and repeating steps (b)-(d) to determine N-type and P-type calibration settings for the first pull-down buffer and the first pull-up buffer, respectively, for the different source-current level.

4. A The invention of claim 1, wherein:
   step (b) comprises:
      (b1) adjusting the drive-strength level of the first pull-down buffer until the first voltage at the first node reaches the first reference voltage level multiple times; and
      (b2) averaging pull-down buffer results from the multiple times to determine the N-type calibration setting for the first pull-down buffer; and
   step (d) comprises:
      (d1) adjusting the drive-strength level of the first pull-up buffer until the second voltage at the second node reaches the second reference voltage level multiple times; and
      (d2) averaging pull-up buffer results from the multiple times to determine the P-type calibration setting for the first pull-up buffer.

5. A The invention of claim 4, wherein steps (b1) and (d1) respectively comprise changing directions of changes in the drive-strength levels between successive pull-down and pull-up buffer results.

6. A The invention of claim 1, wherein the N-type and P-type calibration settings are determined without using any input/output pins of the integrated circuit to connect the first and second pull-down buffers and the first pull-up buffer to any external resistors.

7. A The invention of claim 1, further comprising:
(e) selecting a different source-current level and repeating steps (b)-(d) to determine N-type and P-type calibration settings for the first pull-down buffer and the first pull-up buffer, respectively, for the different source-current level, wherein:
the integrated circuit has (i) a single instance of the first pull-down buffer and (ii) a different instance of the second pull-down buffer and a different instance of the first pull-up buffer for each different bank in the integrated circuit;
the N-type calibration setting is applied to one or more on-line pull-down buffers in the integrated circuit;
for one or more banks, the P-type calibration setting is applied to one or more on-line pull-up buffers in the bank;
step (b) comprises:
  (b1) adjusting the drive-strength level of the first pull-down buffer until the first voltage at the first node reaches the first reference voltage level multiple times; and
  (b2) averaging pull-down buffer results from the multiple times to determine the N-type calibration setting for the first pull-down buffer; and
step (d) comprises:
  (d1) adjusting the drive-strength level of the first pull-up buffer until the second voltage at the second node reaches the second reference voltage level multiple times; and
  (d2) averaging pull-up buffer results from the multiple times to determine the P-type calibration setting for the first pull-up buffer, wherein steps (b1) and (d1) respectively comprise changing directions of changes in the drive-strength levels between successive pull-down and pull-up buffer results; and
the N-type and P-type calibration settings are determined without using any input/output pins of the integrated circuit to connect the first and second pull-down buffers and the first pull-up buffer to any external resistors.

8. An integrated circuit comprising:
pull-down calibration circuitry comprising:
  a first pull-down buffer;
  a programmable current source connected to apply a selected source-current level to the first pull-down buffer at a first node;
  a first voltage reference source configured to generate a first reference voltage;
  a first differential comparator configured to compare a first voltage at the first node to the first reference voltage; and
  a first controller configured to adjust drive-strength level of the first pull-down buffer until the first voltage at the first node reaches the first reference voltage level to determine an N-type calibration setting for the first pull-down buffer; and
pull-up calibration circuitry comprising:
  a second pull-down buffer to which the N-type calibration setting is applied;
  a first pull-up buffer connected to the second pull-down buffer at a second node;
  a second voltage reference source configured to generate a second reference voltage;
  a second differential comparator configured to compare a second voltage at the second node to the second reference voltage; and
  a second controller configured to adjust drive-strength level of the first pull-up buffer until the second voltage at the second node reaches the second reference voltage level to determine a P-type calibration setting for the first pull-up buffer.

9. The invention of claim 8, wherein:
the integrated circuit has (i) a single instance of the first pull-down buffer and (ii) a different instance of the second pull-down buffer and a different instance of the first pull-up buffer for each different bank in the integrated circuit;
the N-type calibration setting is applied to one or more on-line pull-down buffers in the integrated circuit; and
for one or more banks, the P-type calibration setting is applied to one or more on-line pull-up buffers in the bank.

10. The invention of claim 8, wherein:
the first controller is configured to (i) select a different source-current level and (ii) adjust the drive-strength level of the first pull-down buffer until the first voltage at the first node reaches the first reference voltage level to determine an other N-type calibration setting for the first pull-down buffer corresponding to the different source-current level, wherein the other N-type calibration setting is applied to the second pull-down buffer; and
the second controller is configured to adjust the drive-strength level of the first pull-up buffer until the second voltage at the second node reaches the second reference voltage level to determine an other P-type calibration setting for the first pull-up buffer corresponding to the different source-current level.

11. The invention of claim 8, wherein:
the first controller is configured to:
  (1) adjust the drive-strength level of the first pull-down buffer until the first voltage at the first node reaches the first reference voltage level multiple times; and
  (2) average pull-down buffer results from the multiple times to determine the N-type calibration setting for the first pull-down buffer; and
the second controller is configured to:
  (1) adjust the drive-strength level of the first pull-up buffer until the second voltage at the second node reaches the second reference voltage level multiple times; and
  (2) average pull-up buffer results from the multiple times to determine the P-type calibration setting for the first pull-up buffer.

12. The invention of claim 11, wherein the first and second controllers are respectively configured to change directions of changes in the drive-strength levels between successive pull-down and pull-up buffer results.

13. The invention of claim 8, wherein the first and second controllers are configured to determine the N-type and P-type calibration settings without using any input/output pins of the integrated circuit to connect the first and second pull-down buffers and the first pull-up buffer to any external resistors.

14. The invention of claim 8, wherein:
the integrated circuit has (i) a single instance of the first pull-down buffer and (ii) a different instance of the second pull-down buffer and a different instance of the first pull-up buffer for each different bank in the integrated circuit;
the N-type calibration setting is applied to one or more on-line pull-down buffers in the integrated circuit;
for one or more banks, the P-type calibration setting is applied to one or more on-line pull-up buffers in the bank;
the first controller is configured to (i) select a different source-current level and (ii) adjust the drive-strength level of the first pull-down buffer until the first voltage at the first node reaches the first reference voltage level to determine another N-type calibration setting for the first pull-down buffer corresponding to the different source-current level, wherein the other N-type calibration setting is applied to the second pull-down buffer;

the second controller is configured to adjust the drive-strength level of the first pull-up buffer until the second voltage at the second node reaches the second reference voltage level to determine another P-type calibration setting for the first pull-up buffer corresponding to the different source-current level;

the first controller is configured to:
(1) adjust the drive-strength level of the first pull-down buffer until the first voltage at the first node reaches the first reference voltage level multiple times; and
(2) average pull-down buffer results from the multiple times to determine the N-type calibration setting for the first pull-down buffer;

the second controller is configured to:
(1) adjust the drive-strength level of the first pull-up buffer until the second voltage at the second node reaches the second reference voltage level multiple times; and
(2) average pull-up buffer results from the multiple times to determine the P-type calibration setting for the first pull-up buffer, wherein the first and second controllers are respectively configured to change directions of changes in the drive-strength levels between successive pull-down and pull-up buffer results; and the first and second controllers are configured to determine the N-type and P-type calibration settings without using any input/output pins of the integrated circuit to connect the first and second pull-down buffers and the first pull-up buffer to any external resistors.

* * * * *